US006426252B1

United States Patent
Radens et al.

(10) Patent No.: US 6,426,252 B1
(45) Date of Patent: Jul. 30, 2002

(54) SILICON-ON-INSULATOR VERTICAL ARRAY DRAM CELL WITH SELF-ALIGNED BURIED STRAP

(75) Inventors: Carl J. Radens, LaGrangeville; Gary B. Bronner, Stormville; Tze-chiang Chen, Yorktown Heights; Bijan Davari, Mahopac; Jack A. Mandelman, Stormville, all of NY (US); Dan Moy, Bethel, CT (US); Devendra K. Sadana, Pleasantville, NY (US); Ghavam Ghavami Shahidi, Yorktown Heights, NY (US); Scott R. Stiffler, Amenia, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,256

(22) Filed: Oct. 25, 1999

(51) Int. Cl.[7] ........................................... H01L 21/8242
(52) U.S. Cl. ........................ 438/243; 438/155; 438/248; 438/257
(58) Field of Search ................................ 438/243, 241, 438/242, 246, 248, 249, 250, 244, 155, 257

(56) References Cited

U.S. PATENT DOCUMENTS

| | | | |
|---|---|---|---|
| 4,673,962 A | | 6/1987 | Chatterjee et al. |
| 4,830,978 A | * | 5/1989 | Teng et al. ................. 438/242 |
| 5,006,909 A | | 4/1991 | Kosa et al. |
| 5,064,777 A | * | 11/1991 | Dhong et al. ............... 438/242 |
| 5,102,817 A | | 4/1992 | Chatterjee et al. |
| 5,103,276 A | | 4/1992 | Shen et al. |
| 5,164,917 A | | 11/1992 | Shichijo et al. |
| 5,208,657 A | | 5/1993 | Chatterjee et al. |
| 5,225,697 A | | 7/1993 | Melhi et al. |
| 5,252,845 A | | 10/1993 | Kim et al. |
| 5,281,837 A | | 1/1994 | Kobyama et al. |
| 5,300,450 A | | 4/1994 | Shen et al. |
| 5,334,548 A | | 8/1994 | Shen et al. |
| 5,362,665 A | | 11/1994 | Lu et al. |
| 5,504,357 A | | 4/1996 | Kim et al. |
| 5,710,056 A | | 1/1998 | Hsu et al. |
| 5,888,864 A | | 3/1999 | Koh et al. |

OTHER PUBLICATIONS

Parries et al., "A Buried Plate Trench Cell for a 64–Mb DRAM", 1992 Symposium on VLSI Technology Digest of Technical Papers, 1992 IEEE, 2,3 pp.*
Wann et al., "A Capacitorless DRAM Cell on SOI Substrate", 1993 IEEE, pp. 635–638.*
Radens et al., "A Novel Trench DRAM Cell with a Vertical Access Transistor and Buried Strap for 4GB/16GB", 1999 IEEE, pp. 25–28, 1992.*

* cited by examiner

Primary Examiner—Keith Christianson
Assistant Examiner—Yennhu B. Huynh
(74) Attorney, Agent, or Firm—H. Daniel Schnurmann

(57) ABSTRACT

A silicon on insulator (SOI) dynamic random access memory (DRAM) cell, array and method of manufacture. The memory cell includes a vertical access transistor above a trench storage capacitor in a layered wafer. A buried oxide (BOX) layer formed in a silicon wafer isolates an SOI layer from a silicon substrate. Deep trenches are etched through the upper surface SOI layer, the BOX layer and into the substrate. Each trench capacitor is formed in the substrate and, the access transistor is formed on a sidewall of the SOI layer. Recesses are formed in the BOX layer at the SOI layer. A polysilicon strap recessed in the BOX layer connects each polysilicon storage capacitor plate to a self-aligned contact at the source of the access transistor. Dopant is implanted into the wafer to define device regions. Access transistor gates are formed along the SOI layer sidewalls. Shallow trenches are formed and filled with insulating material to isolate cells from adjacent cells. Wordlines and bitlines are formed to complete the memory array.

29 Claims, 7 Drawing Sheets

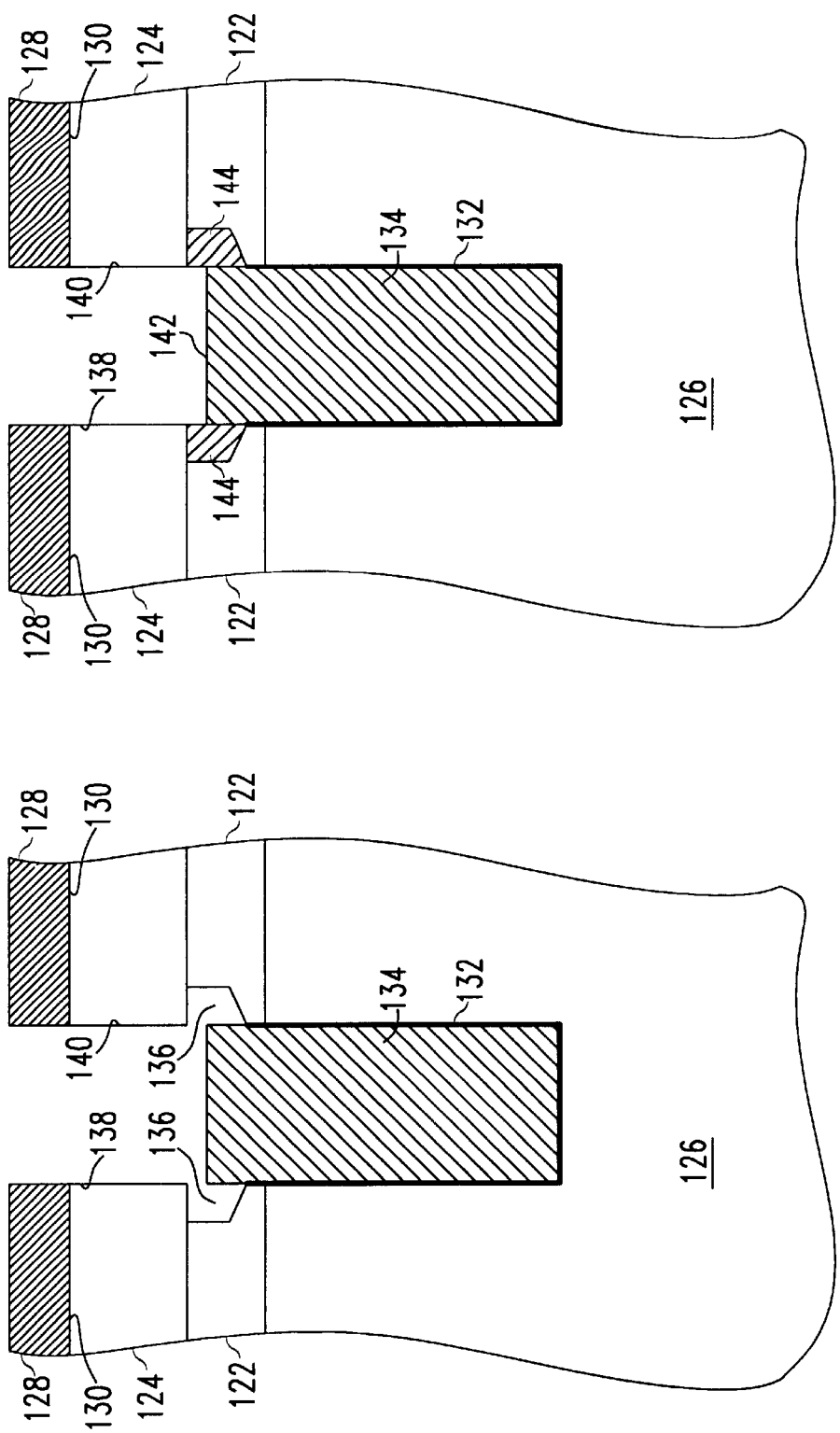

SILICON-ON-INSULATOR VERTICAL ARRAY DRAM CELL WITH SELF-ALIGNED BURIED STRAP

BACKGROUND OF THE INVENTION

1. Field of the Invention

The present invention generally relates to semiconductor memories and, more particularly, to a trench capacitor dynamic random access memory cell with a vertical silicon on insulator access transistor for semiconductor memories.

2. Background Description

Dynamic Random Access Memory (DRAM) cells are well known. A DRAM cell is essentially a capacitor for storing charge and a pass transistor (also called a pass gate or access transistor) for transferring charge to and from the capacitor. Data (1 bit) stored in the cell is determined by the absence or presence of charge on the storage capacitor. Because cell size determines chip density, size and cost, reducing cell area is one of the DRAM designer's primary goals. Reducing cell area is done, normally, by reducing feature size to shrink the cell.

Besides shrinking the cell features, the most effective way to reduce cell area is to reduce the largest feature in the cell, typically, the area of the storage capacitor. Unfortunately, shrinking the capacitor plate area reduces capacitance and, consequently, reduces stored charge. Reduced charge means that what charge is stored in the DRAM is more susceptible to noise, soft errors, leakage and other well known DRAM problems. Consequently, another primary goal for DRAM cell designers is to maintain storage capacitance while reducing cell area.

One way to accomplish this density goal without sacrificing storage capacitance is to use trench capacitors in the cells. Typically, trench capacitors are formed by etching long deep trenches in a silicon wafer and, then, placing each capacitor on its side in the trench, orienting the capacitors vertically with respect to the chip's surface. Thus, the surface area required for the storage capacitor is dramatically reduced without sacrificing capacitance, and correspondingly, storable charge.

However, since using a trench capacitor eliminates much of the cell surface area, i.e., that portion of cell area which was formerly required for the storage capacitor, the cell's access transistor has become the dominant cell feature determining array area. As a result, to further reduce cell and array area, efforts have been made to reduce access transistor area, which include making a vertical access transistor in the capacitor trench. See, for example, U.S. Pat. No. 5,006,909 entitled "DRAM With A Vertical Capacitor And Transistor" to Kosa.

Other approaches to using a vertical access transistor include U.S. Pat. No. 4,673,962 entitled "Vertical DRAM Cell and Method" to Chatterjee et al. and U.S. Pat. No. 5,102,817 entitled "Vertical DRAM Cell and Method" to Chatterjee et al. which both teach a a vertical DRAM cell with a polysilicon channel access transistor. The polysilicon channel access transistor is formed in the same vertical polysilicon layer that serves as the cell storage capacitor plate.

U.S. Pat. No. 5,164,917 entitled "Vertical One-transistor DRAM With Enhanced Capacitance And Process for Fabricating" to Shichijo, U.S. Pat. No. 5,208,657 entitled "DRAM Cell With Trench Capacitor And Vertical Channel in Substrate" to Chatterjee et al., U.S. Pat. No. 5,225,697 entitled "Vertical DRAM Cell and Method" to Malhi et al. and U.S. Pat. No. 5,252,845 entitled "Trench DRAM Cell With Vertical Transistor" to Kim et al. all teach memory cells formed in small square deep trenches that have vertical access transistors. Further, the access transistor is annular, essentially, and formed on the trench sidewalls above the cell trench capacitor. Both Kim et al. and Shichijo teach DRAM cells wherein a layered storage capacitor is formed in and entirely enclosed in the trench.

For another approach, U.S. Pat. No. 5,103,276 entitled "High Performance Composed Pillar DRAM Cell" to Shen et al., U.S. Pat. No. 5,300,450 entitled "High Performance Composed Pillar DRAM Cell" to Shen et al. and U.S. Pat. No. 5,334,548 entitled "High Performance Composed Pillar DRAM-Cell" to Shen et al. teach etching a grid-like pattern to form individual pillars. A common capacitor plate is formed at the bottom of the pillars. A diffusion on all sides of the bottom of the cell pillar serves as a cell storage node. Each pillar's storage diffusion is isolated from adjacent pillars by a dielectric pocket formed beneath the common capacitor plate. An access transistor channel is along one side of each pillar and disposed between the storage node and a bitline diffusion, which is at the top of the pillar. The access transistor gate is formed on one side of the pillar, above the common capacitor plate.

U.S. Pat. No. 5,281,837 entitled "Semiconductor Memory Device Having Cross-Point DRAM Cell Structure" to Kohyama, U.S. Pat. No. 5,362,665 entitled "Method of Making Vertical DRAM Cross-Point Memory Cell" to Lu and U.S. Pat. No. 5,710,056 entitled "DRAM With a Vertical Channel Structure And Process For Manufacturing The Same" to Hsu teach yet another approach wherein DRAM cells have their storage capacitor formed above the access transistor. U.S. Pat. No. 5,504,357 entitled "Dynamic Random Access Memory having A Vertical Transistor" to Kim et al. teaches a buried bitline transistor with the bitline formed at the bottom of a trench and the storage capacitor is formed above the transistor, at the wafer surface.

Performance is equally as important as density to DRAM design. Silicon-on-insulator (SOI) has be used to decrease parasitic capacitance and hence to improve integrated circuit chip performance. SOI reduces parasitic capacitance within the integrated circuit to reduce individual circuit loads, thereby improving circuit and chip performance. However, reducing parasitic capacitance is at odds with increasing or maintaining cell storage capacitance. Accordingly, SOI is seldom used for DRAM manufacture. One attempt at using SOI for DRAMS is taught in U.S. Pat. No. 5,888,864 entitled "Manufacturing Method of DRAM Cell Formed on An Insulating Layer Having a Vertical Channel" to Koh et al. Koh et al. teaches a SOI DRAM formed in a dual sided wafer circuit fabrication process. In the dual sided wafer fabrication process of Koh et al. storage capacitors are formed on one side of the wafer and, the access transistors are formed on the other side of the wafer.

Thus, there is a need for increasing the number of stored data bits per chip of Dynamic Random Access Memory (DRAM) products. There is also a need for improving DRAM electrical performance without impairing cell charge storage.

SUMMARY OF THE INVENTION

It is therefore a purpose of the present invention to increase the Dynamic Random Access Memory (DRAM) integration packing density;

It is another purpose of the present invention to decrease DRAM cell area;

It is yet another purpose of the present invention to increase the number of bits per DRAM chip;

It is yet another purpose of the present invention to reduce parasitic capacitance within DRAM chips;

It is yet another purpose of the present invention to improve DRAM electrical performance;

It is yet another purpose of the invention to achieve trench capacitor DRAM cell density while benefitting from the reduced parasitic capacitance, leakage and improved performance of silicon on insulator technology.

The present invention is a vertical Dynamic Random Access Memory (DRAM) trench-capacitor cell and array in a Silicon-On-Insulator (SOI) substrate and an SOI DRAM chip. The cell has a vertical trench capacitor and a vertical insulated gate Field-Effect Transistor (FET) formed on the trench sidewall. A buried oxide layer (BOX) in the SOI substrate forms a sacrificial protective sidewall collar along the upper edge of the capacitor region. The vertical FET is formed along the upper sidewall of the trench, above the trench capacitor. Straps formed in recesses in the trench sidewall or the BOX layer. The straps connect the capacitor plate to the source of the vertical FET. Thus, the cell occupies less horizontal chip area than a conventional planar DRAM cell.

The cells are formed in a silicon wafer. First, a buried oxide (BOX) layer is formed in the wafer which isolates a surface SOI layer from a thicker silicon substrate. The trench capacitor is formed in the substrate and the access transistor is formed on a sidewall of the SOI layer. A polysilicon strap, formed in a recess in the BOX layer and connected to the polysilicon plate of the storage capacitor provides a self-aligned contact to the source of the access transistor. The cells are formed in the silicon wafer after forming the BOX layer by etching deep trenches are etched through the upper surface SOI layer, the BOX layer and into the substrate. Cell capacitor plates are formed, primarily, in the substrate portion of the deep trenches. Recesses are formed in the BOX layer portion of the deep trenches immediately below the SOI layer. Conductive straps are formed in the recesses, strapping the capacitor plates to the surface SOI layer. Dopant is implanted into the wafer to define device regions. Access transistor gates are formed along the SOI layer sidewalls of the deep trenches. Shallow trenches are formed and filled with insulator to isolate cells from adjacent cells. The surface is planarized. Wordlines and bitlines are formed on the surface to complete the memory array.

BRIEF DESCRIPTION OF THE DRAWINGS

The foregoing and other objects, aspects and advantages will be better understood from the following detailed preferred embodiment description with reference to the drawings, in which:

FIGS. 2A–I illustrate the steps of the process of forming vertical DRAM cells according to FIG. 1;

DETAILED DESCRIPTION OF A PREFERRED EMBODIMENT OF THE INVENTION

Figure 1:
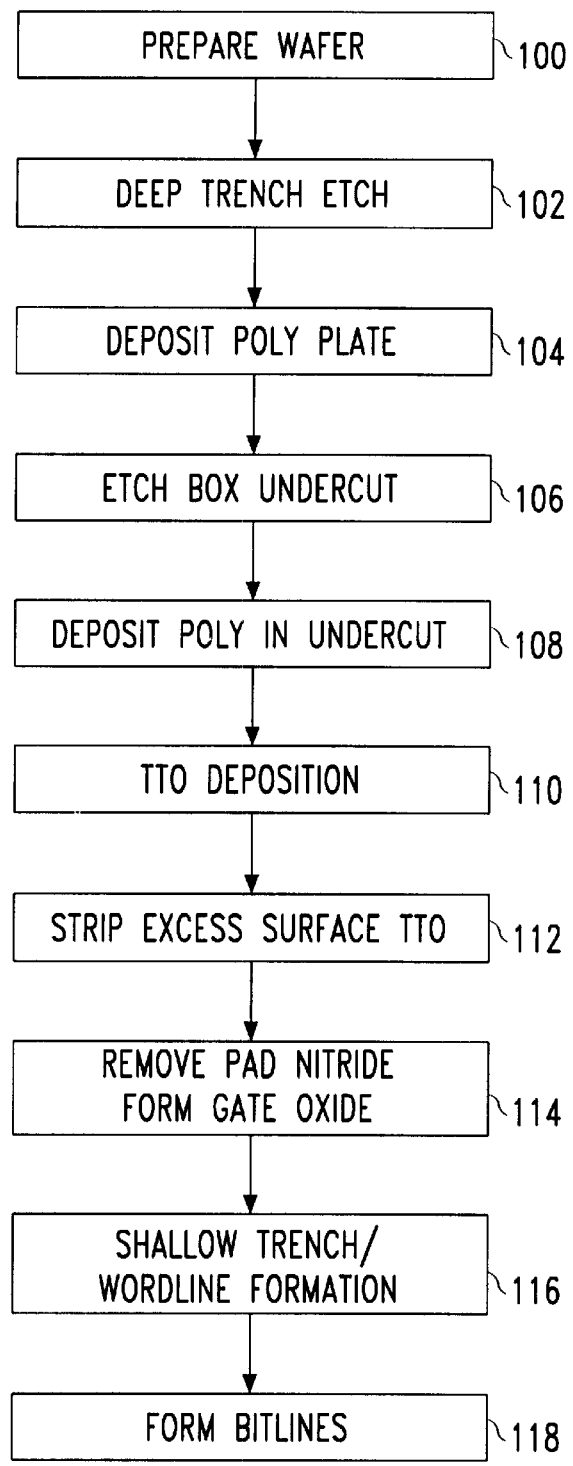
FIG. 1 is a flow diagram of the preferred embodiment process for forming a vertical DRAM cell with a self aligned buried strap.

Referring now to the drawings, and more particularly, FIG. 1 shows a flow diagram of the preferred embodiment silicon-on-insulator (SOI) process for forming vertical DRAM cells. First, in step 100, a layered semiconductor wafer is prepared. Preferably, the initial wafer is a single crystal silicon wafer. A buried oxide (BOX) layer is formed in the silicon wafer. The BOX layer isolates a silicon layer (SOI layer) above the BOX layer from a thick substrate, which is much thicker than the silicon layer. Then, in step 102 deep trenches are formed, preferably, using a typical photolithographic and etch process. The deep trenches are formed through the silicon layer, the BOX layer and into the thicker substrate. A thin node dielectric layer is conformally formed on the wafer and along the deep trench sidewalls. After forming the thin node dielectric layer a capacitor plate is formed in step 104 in the deep trenches. Then, in step 106, the thin node dielectric layer is stripped from the SOI layer and the upper portion of the BOX layer sidewalls are recessed around the upper surface of each of the capacitor plates.

Next, in step 108, the recesses are filled with conductive strapping material. Then, in step 110, oxide is formed on the wafer and, especially, on top of the capacitor plate, i.e., trench top oxide (TTO) is formed. In step 112 excess TTO is stripped from the wafer surface. In step 114 the pad nitride layer is removed from the wafer surface and gate oxide is formed on the trench sidewalls. In step 116 access transistor gates are formed along the trench sidewalls and cells are defined using shallow trench isolation techniques. Finally, in step 118, cell definition is completed by defining device regions and device wells and forming bit lines and word lines. FIGS. 2A–I illustrate the steps of the process of forming a vertical DRAM cell in a deep trench 120 according to the steps of FIG. 1. First, as noted above, the BOX layer 122 is formed in a single crystal silicon wafer. The BOX layer 122 separates the SOI silicon layer 124 from the remaining thicker silicon substrate 126. Although the BOX layer 122 is formed, preferably, using a high-dose oxygen ion implantation in the single crystal wafer, any other suitable SOI technique may be employed. The preferred BOX layer 122 thickness is 300 nm, but the BOX layer 122 may be 10 nm to 500 nm thick. BOX layer 122 thickness may be selected by adjusting ion implantation dose and energy. The SOI silicon layer 124, preferably, is 500 nm thick. However, the SO layer 124 may be 100 nm to 1000 nm thick depending on the desired cell access transistor channel length and SOI layer 124 thickness may be adjusted using chemical vapor deposition (CVD) epitaxial growth. Having prepared the layered wafer, memory cells may be formed on the wafer or the wafer may be stored for future use.

Preferred embodiment DRAM cell formation continues by forming a pad layer 128 of an insulating material such as silicon nitride (SiN) on the upper surface 130 of silicon layer 124. The pad layer 128 may be formed using low-pressure CVD (LPCVD), for example, to deposit a 10 nm to 500 nm, preferably 200 nm, thick SiN layer. Optionally, prior to forming the pad LPCVD SiN layer 128, a thin (2 nm to 10 nm, preferably 5 nm) thermal oxide layer (not shown) may be formed on the surface 130 of SOI silicon layer 124.

Having prepared the wafer in step 100, deep trenches 120 are opened through the SO layer 124, BOX layer 122 and into the substrate 126 in step 102. A hard mask layer (not shown) of boron silicate glass (BSG) is formed on the SiN pad layer 24. Alternatively, any suitable hard mask material such as undoped silicate glass (USG) may be used for the hard mask layer. The deep trenches 120 are formed using a conventional photolithography technique to pattern the BSG hard mask layer and then the trenches are etched using an anisotropic dry etch technique, such as Reactive Ion Etch (RIE). Preferably, the deep trenches 120 extend 6 µm into substrate 126 but, may extend 3 µm to 10 µm into the substrate 126.

The storage capacitor counter-electrode, i.e., the common capacitor plate surrounding the trench 120, is formed, preferably, by doping the substrate 124 with a relatively high concentration of an appropriate n-type dopant. Alternatively, the substrate may be un-doped and, after etching the trenches 120, the substrate 126 trench sidewalls may be doped appropriately and, the dopant is outdiffused into the substrate 126 to form the counter-electrode. After forming the trenches 120 and, if necessary, the counter-electrode a thin (25–60 Å) node dielectric layer 132 is formed, preferably an LPCVD SiN layer, which is the storage capacitor dielectric.

It should be noted that the preferred embodiment is described herein with devices and device regions being doped for a particular device type, i.e. n-type FETs (NFETs). The described device type is for example only and not intended as a limitation. A person of ordinary skill would understand how to replace NFETs with p-type FETs (PFETs) and n-type dopant with p-type dopant where appropriate without departing from the spirit or scope of the invention.

Figures 2A, 2B:
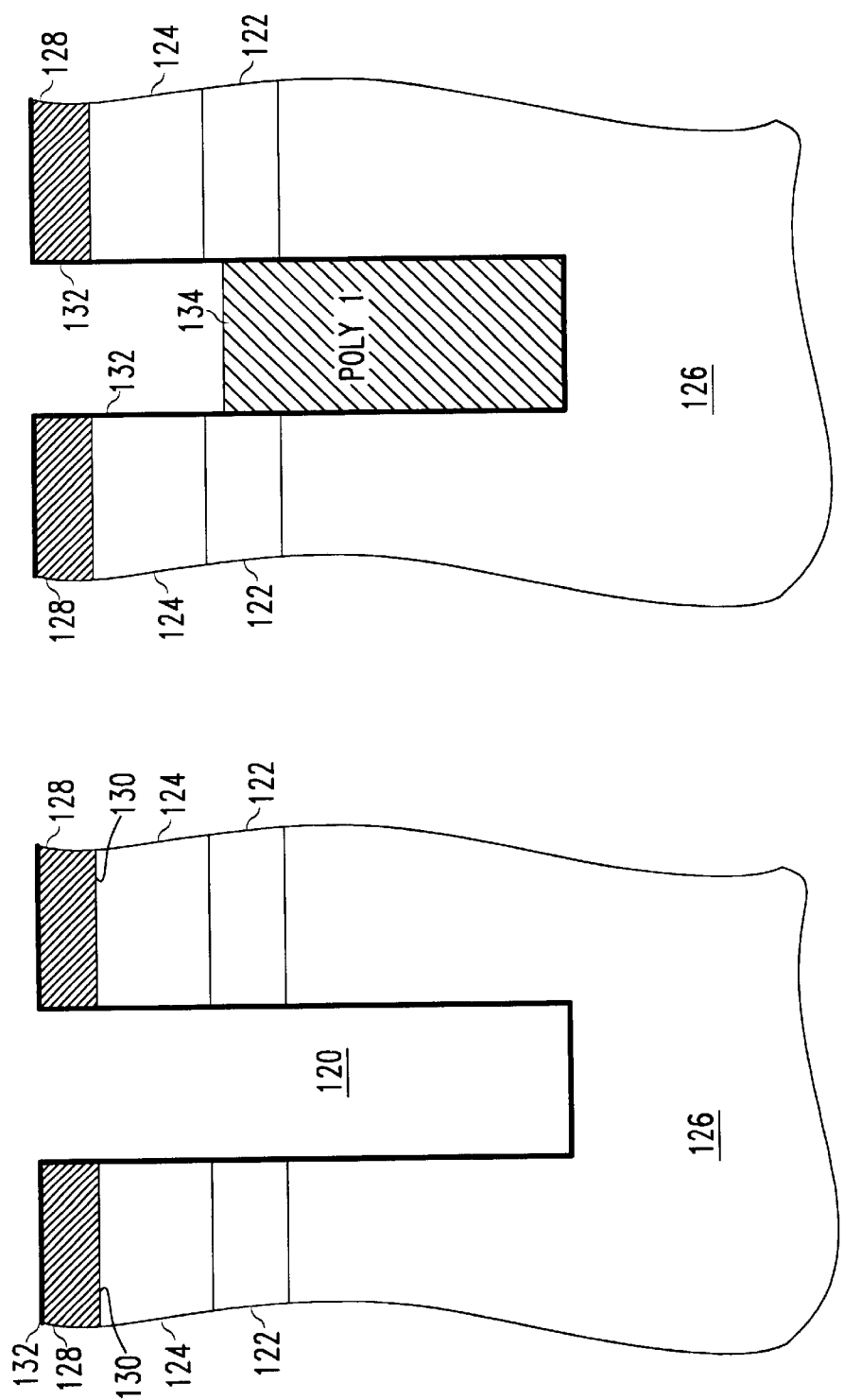

Next, in step 104 as shown in FIG. 2B, a capacitor plate 134 is formed in trenches 120. The capacitor plate 134 is formed by depositing a doped polysilicon layer using LPCVD, preferably doped with n-type dopant. Then, the doped polysilicon layer is planarized to the pad layer 128 and recessed into the deep trench 120 to a point beneath the SOI layer 124 and within the BOX layer 122, preferably, using an isotropic dry etch such as a $SF_6$ plasma.

The thin node dielectric 132 is stripped from SOT and BOX trench sidewalls and, recesses 136 are formed as shown in FIG. 2C. The thin node dielectric 132 is stripped from the trench sidewalls, preferably, using a wet etch such as hydrofluoric acid, which exposes SOT layer 124 sidewalls 138, 140 and the upper edge of BOX layer 122. Then, the exposed sidewall portion of BOX layer 122 is isotropically etched, preferably using a wet solution containing HF to form recesses 136 beneath exposed sidewalls 138, 140. The etch time is selected such that the oxide removal does not expose the top of substrate 126 and, the recess 136 is contained within the BOX layer 122. Thus, the recesses 136 are bounded at the top by SOT layer 124 and on one side by thin node dielectric layer 132 along the upper end of trench capacitor plates 134. So, subsequent to forming the recesses 136, a wet strip is used to etch exposed thin node layer 132 material from within the recesses 136, exposing the upper end of trench capacitor plates 134 therein.

Next, an interfacial treatment of a thin dielectric surface layer (not shown), such as a 7 Å oxide or nitride layer, is formed on SOT sidewalls 138, 140 and on the exposed upper surface 142 of polysilicon plate 134. This thin, 7 Å dielectric interfacial treatment layer controls and limits the extent of outdiffusion from the polysilicon plate 134 into SOI layer 124. Thus, the thin dielectric interfacial treatment layer is not completely isolating, but is electrically conductive for electron tunneling along the side of polysilicon plate 134 and at the underside of SOT layer 124.

In step 108 a thin strap layer is deposited and excess strap material is removed leaving straps 144 shown in FIG. 2D. The thin strap layer, which is of sufficient thickness to completely fill recesses 136, preferably is 30 nm thick and may be 10–50 nm thick. The strap layer is formed using LPCVD to deposit the desired thickness of doped polysilicon. Then, the excess strap material is selectively removed from horizontal and vertical surfaces, the remaining polysilicon strap material forming straps 144 in recesses 136. Any suitable selective wet etch or dry etch with selectivity to the interfacial treatment of the exposed SOI sidewalls 138, 140 may be used to remove the excess strap material. Thus, when dopant is subsequently outdiffused into SOI layer 124, the straps 144 form a self-aligned buried electrical connection between the trench polysilicon capacitor plate 134 and the SOI layer 124 thereabove.

Figure 2F:
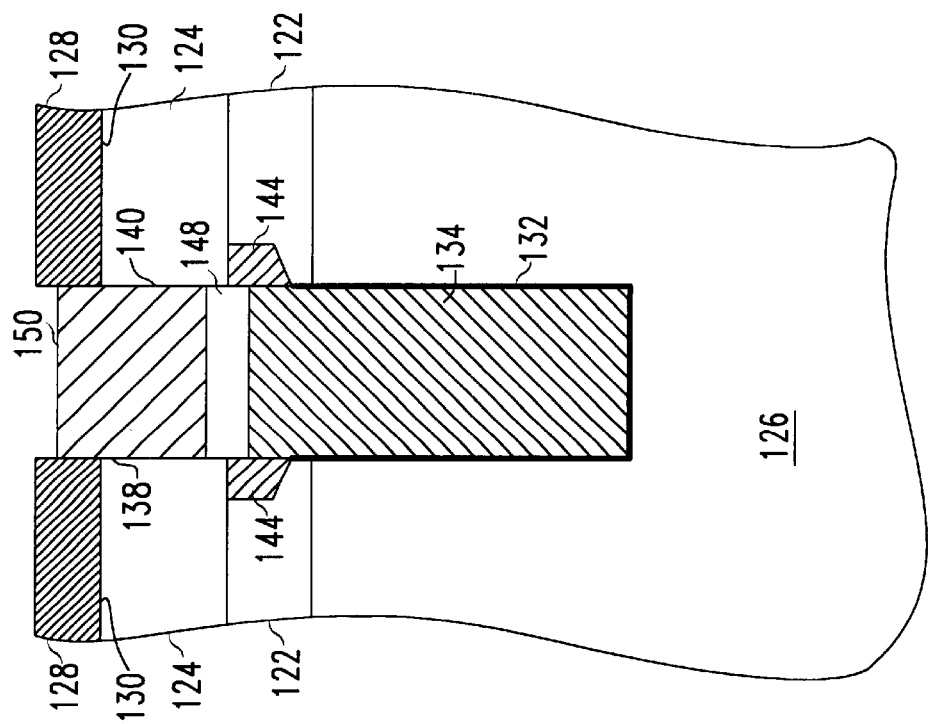
Figure 2E:
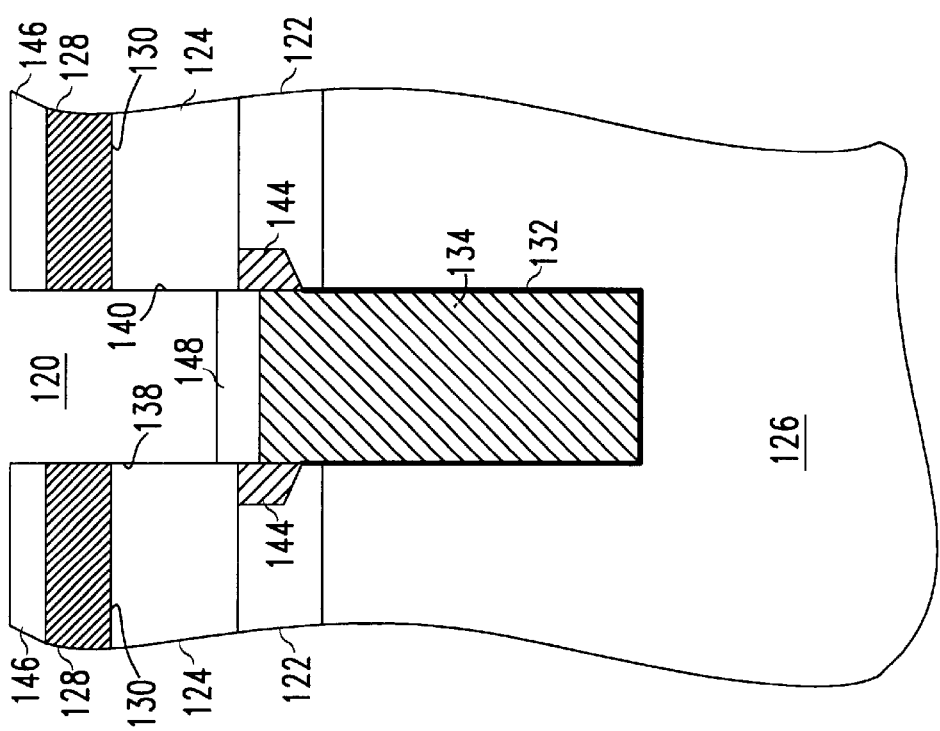

In step 110 an oxide layer 146, shown in FIG. 2E, is formed on the wafer, forming trench-top-oxide (TTO) 148 on capacitor plates 134. Preferably, an anisotropic high density plasma (HDP) is used to deposit the TTO layer 146, 148. HDP has a high deposition rate along the horizontal surfaces, and a slow deposition rate along vertical surfaces such as sidewalls 138, 140.

Then, excess surface oxide layer 146 is removed from the pad SiN 128 surface in step 112 as shown in FIG. 2F. Photoresist plugs 150 are formed in trenches 120 on TTO 148. Preferably, a photoresist layer is deposited and etched back such that only photoresist plugs 150 remain in the trenches 120. The excess surface oxide 146 is removed using an appropriate etch such as RIE. Then, the photoresist plugs 150 are removed. Optionally, the excess surface oxide layer 146 may be removed using a typical selective chemical mechanical polishing (CMP) step that is selective to nitride.

Figure 2H:
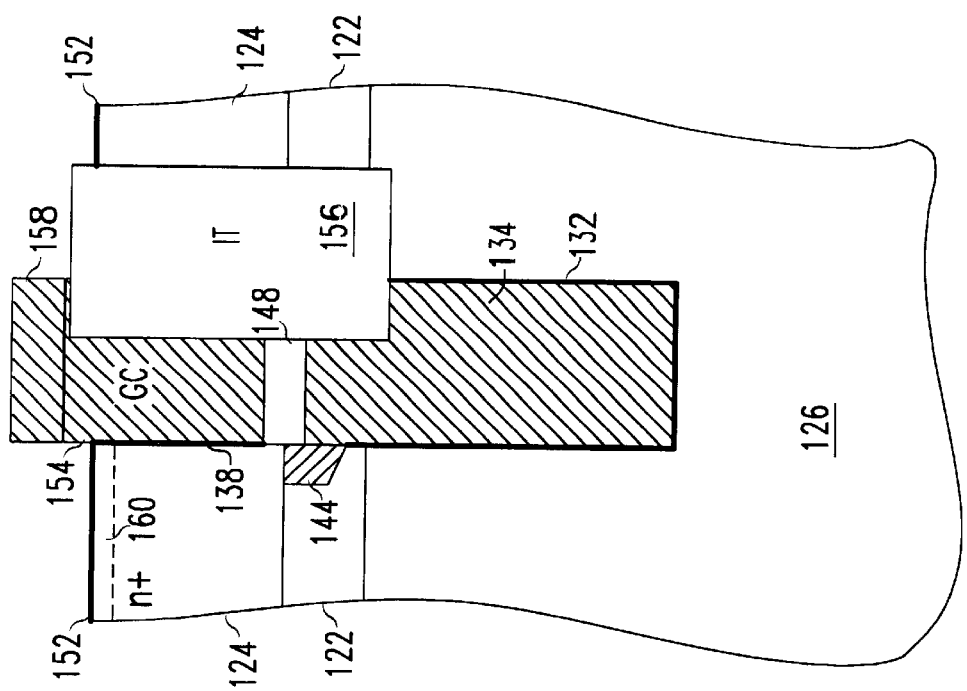
Figure 2G:
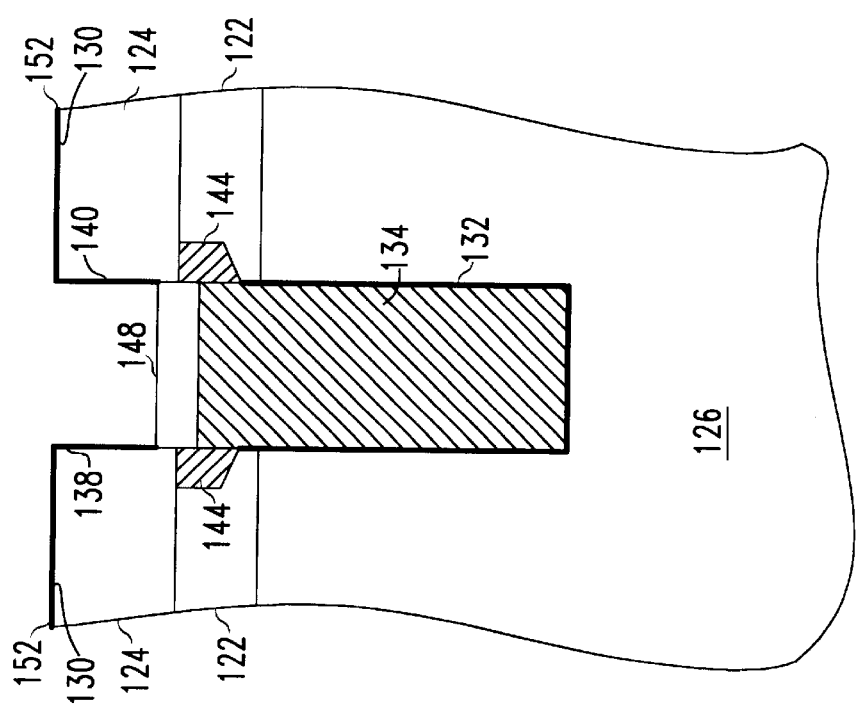

Next, the pad SiN 128 is removed and gate oxide 152, shown in FIG. 2G, is formed in step 114. The pad SiN layer 128 is removed using an appropriate etchant and a 5–20 nm sacrificial oxide layer, preferably 10 nm, is grown by thermal oxidation. The sacrificial oxide layer (not shown) repairs superficial surface damage that may have occurred in the exposed SOI layer 124 sidewalls 138, 140. Selected device regions are defined in the wafer and are doped using ion implantation. The sacrificial oxide layer is stripped using a hydrofluoric acid solution. Then, a 2–100 nm gate oxide layer, preferably 5 nm, is grown on the SOI layer 124 using thermal oxidation.

As shown in FIG. 2H, cell access transistor formation is completed in step 116. A gate conductor (GC) 154 is formed, filling trenches 120, preferably, using LPCVD to deposit a polysilicon layer. A protective nitride pad layer (not shown) is deposited on the polysilicon layer. Then, a device isolation trench 156 is formed using a conventional shallow trench isolation (STI) process, such as conventional photolithography and dry etching, e.g., RIE. The RIE formed shallow trenches remove one deep trench sidewall 140 and extends down through the SOI silicon layer 124, BOX layer 122 and into substrate 126. Thus, the shallow trenches 156, essentially, form isolated silicon islands of SOI layer 124 on BOX layer 122 with a gate conductor 154 remaining along one sidewall 138, thereby forming each cell's access transistor gate. Then, the shallow trenches 156 are filled with a dielectric material such as silicon dioxide using a process such as an anisotropic HDP deposition. Then, the surface is planarized to the protective SiN pad surface using a conventional CMP process. The protective SiN pad is stripped from the wafer using a standard wet etch. A polysilicon wordline layer is formed on the surface in contact with the gate conductor 154 and patterned, using lithography and dry etching to form wordlines 158.

Figure 2I:
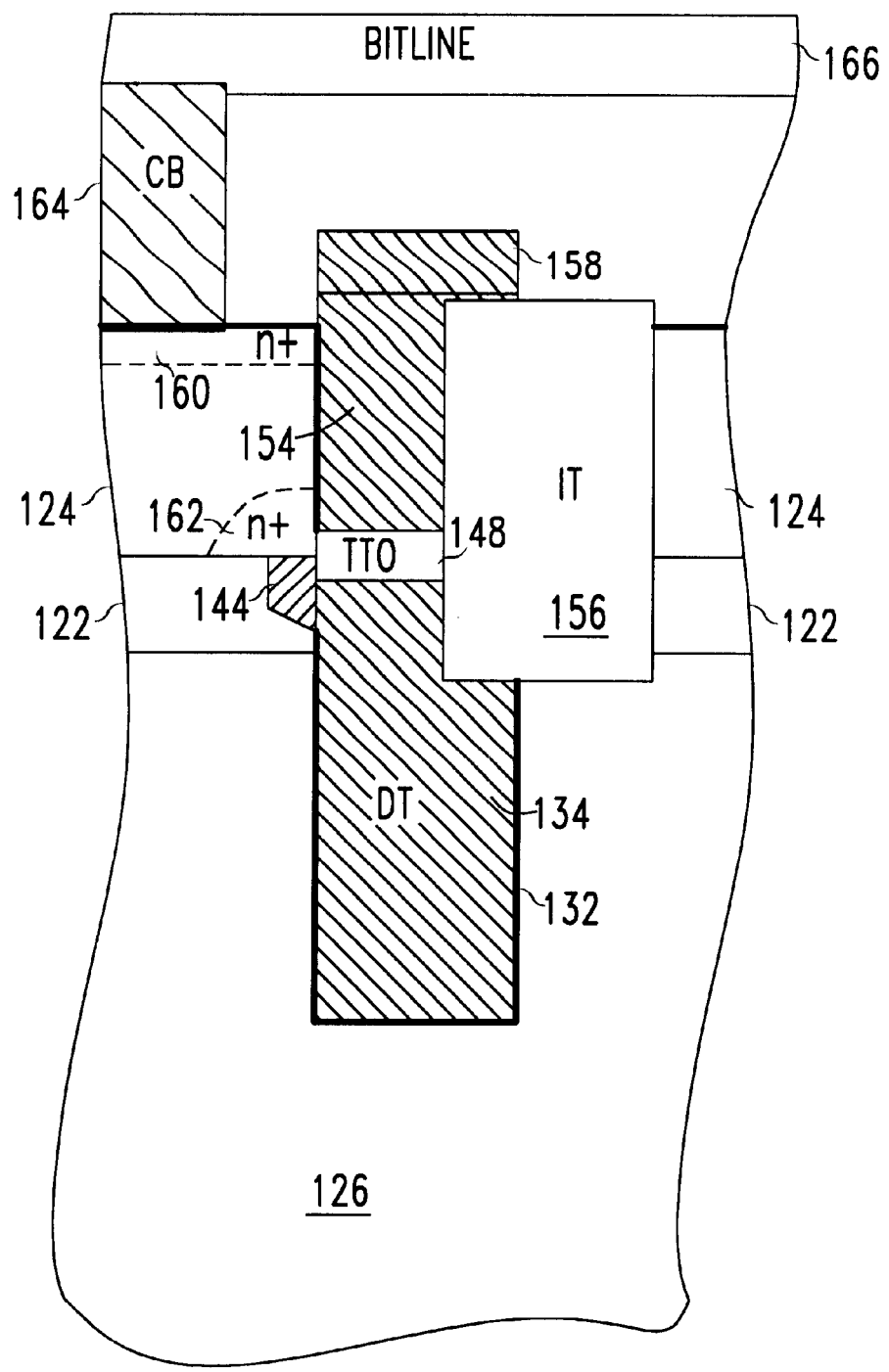

In FIG. 2I shows a cross section of a completed preferred cell structure. An access transistor drain diffusion 160 is formed in the upper surface 130 of each SOT island by implanting and diffusing an appropriate dopant. Coincident with diffusing access transistor drain diffusion 160, access transistor source diffusion 162 is formed when dopant outdiffuses from straps 144 into the bottom of each SOI island sidewall 138. Next, bitline contacts 164 are formed and bitlines 166 are formed thereabove using conventional bitline formation techniques.

Figure 3:
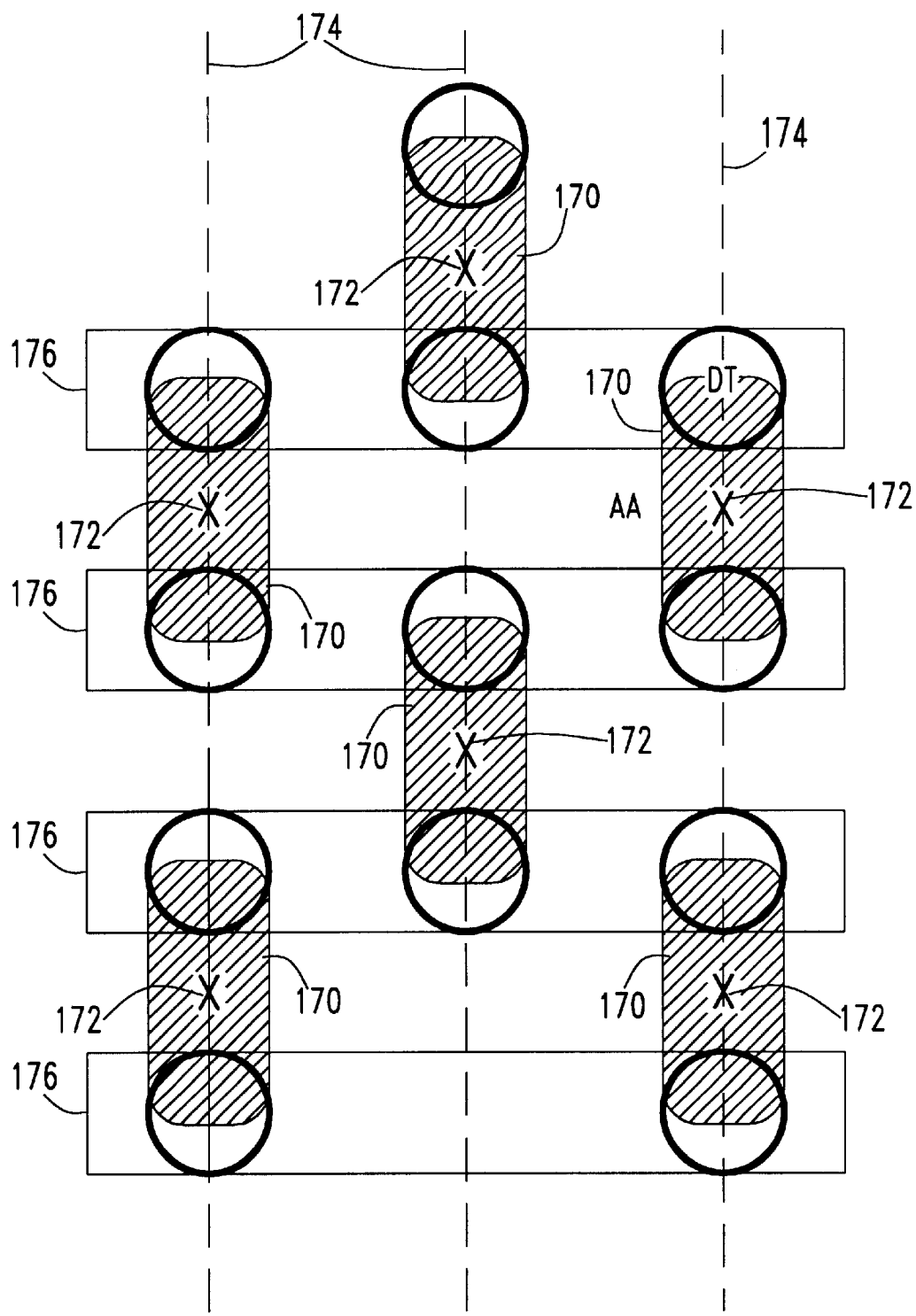
FIG. 3 shows a plan view of an example of a portion of a preferred embodiment memory array of SOI Vertical Array Device Trench Capacitor DRAM cells of FIG. 2I.

FIG. 3 shows a plan view of an example of a portion of a preferred embodiment memory array of SOT DRAM cells with vertical access FETs and a self-aligned buried strap of FIG. 2I. Bitline (BL) diffusions 170 are shared access transistor drain diffusions 160, each being shared by cell pairs. Bitline contacts 164 are represented by Xs 172. Bitlines 166 are represented by vertical dotted lines 174 and wordlines 158 are represented by horizontally spaced rectangles 176. Accordingly, the preferred embodiment cells form an array of a densely packed DRAM cells for high density, high capacity high performance DRAM chips.

It should be noted that the preferred embodiment as described herein with bitline contact 164 and bitline diffusion regions 172 being shared by two adjacent cell structures as shown in FIG. 2I. Those skilled in the art will recognize that other cell layouts, such as those that do not share bitline contacts structures 164, 172, may also be formed without departing in spirit or scope from the present invention.

While the invention has been described in terms of preferred embodiments, those skilled in the art will recognize that the invention can be practiced with modification within the spirit and scope of the appended claims.

We claim:

1. A method of forming a memory cell in a layered semiconductor wafer, said layered semiconductor wafer including a buried dielectric layer, said method comprising the steps of:
    a) forming a trench capacitor in a layered semiconductor wafer;
    b) forming a conductive strap in a buried dielectric layer from a plate of said trench capacitor to a bottom surface of a top semiconductor layer of said layered semiconductor wafer;
    c) forming a vertical transistor along a sidewall of said top semiconductor layer; and
    d) forming semiconductor islands of said top semiconductor layer, said vertical transistor being on one of said semiconductor islands.

2. A method as in claim 1, wherein the layered semiconductor wafer is a silicon wafer, the buried dielectric layer is a buried oxide (BOX) layer and the step (a) of forming a trench capacitor comprises the steps of:
    i) forming first trenches in said top silicon layer, said BOX layer and into said substrate;
    ii) forming a dielectric layer on said substrate and in said trenches; and
    iii) filling said trenches with polysilicon to a point in said BOX layer below said top silicon layer.

3. A method as in claim 2, wherein the step (i) of forming the first trenches comprises the steps of:
    A) forming a protective pad layer on said top silicon layer;
    B) forming a hard mask pattern on said protective pad layer to define said first trenches; and
    C) etching said first trenches through the top silicon layer, the BOX layer and into the silicon substrate.

4. A method as in claim 1, wherein the layered semiconductor wafer is a silicon wafer, the buried dielectric layer is a buried oxide (BOX) layer and the step (b) of forming the conductive strap comprises the steps of:
    i) forming recess areas in the BOX layer sidewalls of said first trenches, said recesses being bounded on the top by said top silicon layer and on one side by said capacitor plates; and
    ii) filling said recess areas with doped polysilicon.

5. A method as in claim 4, wherein the step (ii) of filling the recesses comprises the steps of:
    A) depositing a conformal layer of polysilicon; and
    B) selectively etching said polysilicon layer, straps remaining in said recess areas and in contact with said capacitor plates and a bottom surface of said top silicon layer.

6. A method as in claim 4, wherein the step (i) of forming recess areas further includes forming an oxidation of nitride on exposed silicon surfaces.

7. A method as in claim 1, wherein the layered semiconductor wafer is a silicon wafer, the buried dielectric layer is a buried oxide (BOX) layer, the conductive gate material is polysilicon and the step (c) of forming the vertical transistors comprises:
    i) forming a trench top oxide (TTO) layer on said capacitor plates, a top of said TTO layer being below a top surface of said top silicon layer;
    ii) filling said trenches above said TTO layer with polysilicon, said polysilicon extending along trench sidewalls between said TTO layer and said top surface; and
    iii) forming a diffusion layer of a first dopant type in said top surface, dopant of said first dopant type outdiffusing from said conductive straps and forming a buried source diffusion.

8. A method as in claim 1, wherein the layered semiconductor wafer is a silicon wafer, the buried dielectric layer is a buried oxide (BOX) layer and the step (d) of forming semiconductor islands comprises:
    i) forming a plurality of second trenches through said top silicon layer and said buried oxide layer; and
    ii) filling said second trenches with insulating material.

9. A method of forming an array of memory cells as in claim 1, wherein the layered semiconductor wafer is a silicon wafer, the buried dielectric layer is a buried oxide (BOX) layer, the method further comprising:
    e) forming wordlines connected to gates of a plurality of said vertical transistors; and
    f) forming a plurality of bitlines connected to bitline diffusions of a plurality of said vertical transistors.

10. A method of forming a,dynamic random access memory (DRAM), including an array of trench capacitor memory cells, said trench capacitor memory cells being formed in a layered silicon wafer, said layered silicon wafer including a buried oxide layer isolating a substrate from a surface silicon layer, said method comprising the steps of:
    a) forming trench capacitors in a substrate of a layered silicon wafer;
    b) forming conductive straps in a buried oxide (BOX) layer above said substrate from said trench capacitors to a bottom surface of a top silicon layer, said top silicon layer being above said BOX layer;
    c) forming vertical transistors along a sidewall of said top silicon layer; and
    d) forming silicon islands of said top silicon layer, said vertical transistors each being on one of said silicon islands.

11. A method of forming a DRAM as in claim 10, wherein the step (a) of forming trench capacitors comprises the steps of:

i) forming first trenches in said top silicon layer, said BOX layer and into said substrate;

ii) forming a dielectric layer on said substrate and in said trenches; and iii) filling said trenches with polysilicon to a point in said BOX layer below said top silicon layer.

12. A method of forming a DRAM as in claim 11, wherein the step (i) of forming the first trenches comprises the steps of:

A) forming a protective pad layer on said top silicon layer;

B) forming a hard mask pattern on said protective pad layer to define said first trenches; and C) etching said first trenches through the top silicon layer, the BOX layer and into the silicon substrate.

13. A method of forming a DRAM as in claim 11, wherein the step (b) of forming the conductive strap comprises the steps of:

i) forming recess areas in the BOX layer sidewalls of said first trenches, said recesses being bounded on the top by said top silicon layer and on one side by said capacitor plates; and ii) filling said recess areas with doped polysilicon.

14. A method as in claim 13, wherein the step (ii) of filling the recesses comprises the steps of:

A) depositing a conformal layer of polysilicon; and

B) selectively etching said polysilicon layer, straps remaining in said recess areas and in contact with said capacitor plates and a bottom surface of said top silicon layer.

15. A method as in claim 13, wherein the step (i) of forming recess areas further includes forming an oxidation of nitride on exposed silicon surfaces.

16. A method of forming a DRAM as in claim 11, wherein the step (c) of forming the vertical transistors comprises:

i) forming a trench top oxide (TTO) on said capacitor plates, a top surface of said TTO being below a top surface of said top silicon layer;

ii) filling said trenches above said TTO with polysilicon, said polysilicon extending along trench sidewalls between said TTO and said top surface; and iii) forming a diffusion layer of a first dopant type in said top surface, dopant of said first dopant type outdiffusing from said conductive straps and forming a buried source diffusion.

17. A method of forming a DRAM as in claim 11, wherein the step (d) of forming semiconductor islands comprises:

i) forming a plurality of second trenches through said top silicon layer and said buried oxide layer; and ii) filling said second trenches with oxide.

18. A method of forming a DRAM as in claim 11, wherein further comprising the steps of:

e) forming wordlines connected to gates of a plurality of said vertical transistors; and f) forming a plurality of bitlines connected to bitline diffusions of a plurality of said vertical transistors.

19. A method of forming memory cells comprising the steps of:

a) forming a buried dielectric layer in a semiconductor wafer;

b) etching first trenches through an upper surface layer of said semiconductor wafer through said buried dielectric layer and into a substrate beneath said buried dielectric layer;

c) forming a capacitor plate in each of said first trenches within said substrate;

d) recessing said buried dielectric layer within said first trenches;

e) forming conductive straps in said recesses from said capacitor plates to said surface layer;

f) implanting dopant into said semiconductor wafer;

g) filling said first trenches with conductive gate material; and h) forming second trenches through said surface layer.

20. The method of claim 19, wherein the semiconductor wafer is a silicon wafer and the step (a) of forming the buried dielectric layer comprises implanting oxygen ions into the silicon wafer to form a buried oxide (BOX) layer isolating the silicon surface layer from a thicker silicon substrate beneath said BOX layer.

21. The method of claim 20 wherein the silicon surface layer is thickened after the BOX layer is formed.

22. The method of claim 20, wherein the step (b) of etching the first trenches comprises-the steps of:

i) forming a protective pad layer on said silicon layer;

ii) forming a hard mask pattern on said protective pad layer to define said first trenches;

iii) etching said first trenches through the silicon surface layer, the BOX layer and into the thicker silicon substrate.

23. The method of claim 22, wherein before the step (i) a thermal oxide layer is grown on an upper surface of the silicon layer.

24. The method of claim 22, wherein the capacitor plate is polysilicon and step (d) of forming the capacitor plate comprises the steps of:

i) forming a dielectric layer on the sidewalls of said first trenches;

ii) filling the first trenches with polysilicon; and iii) etching said polysilicon into said first trenches partially through said BOX layer.

25. The method of claim 24, wherein step d of recessing the BOX layer comprises etching recesses into BOX layer sidewalls of said first trenches above said polysilicon plates.

26. The method of claim 25, wherein the step (e) of forming the conductive straps comprises the steps of:

i) depositing a layer of polysilicon; and ii) etching excess said polysilicon layer, straps remaining in said recesses and in contact with said capacitor plates and a bottom surface of said surface silicon layer.

27. The method of claim 26, wherein before the step (i) of forming polysilicon layer, an oxidation of nitride is formed on exposed silicon surfaces.

28. The method of claim 26, wherein the conductive gate material is polysilicon and the step (g) of filling the trenches with polysilicon comprises:

i) forming a trench top oxide layer on said capacitor plates;

ii) depositing a polysilicon layer of sufficient thickness to fill said first trenches; and iii) removing said polysilicon layer from an upper surface of said silicon layer, polysilicon remaining in and filling said first trenches.

29. A method of claim 28 wherein after the step (h) of forming second trenches said second trenches are filled with dielectric material.

* * * * *